United States Patent
Min et al.

(10) Patent No.: US 8,310,853 B2
(45) Date of Patent: *Nov. 13, 2012

(54) LAYOUT STRUCTURE OF BIT LINE SENSE AMPLIFIERS FOR A SEMICONDUCTOR MEMORY DEVICE

(75) Inventors: Young-Sun Min, Seoul (KR); Kyu-Chan Lee, Seoul (KR); Chul-Woo Yi, Seongnam-si (KR); Jong-Hyun Choi, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 12/987,539

(22) Filed: Jan. 10, 2011

(65) Prior Publication Data

US 2011/0103166 A1    May 5, 2011

Related U.S. Application Data

(62) Division of application No. 12/078,724, filed on Apr. 3, 2008, now Pat. No. 7,869,239.

(30) Foreign Application Priority Data

Apr. 4, 2007   (KR) .............................. 2007-0033135

(51) Int. Cl.
*G11C 5/02* (2006.01)

(52) U.S. Cl. ....... 365/51; 365/205; 365/49.11; 365/154; 365/189.15; 365/189.02; 365/189.05; 365/190; 365/202; 365/207; 365/210.13; 327/51; 327/57; 716/138

(58) Field of Classification Search ............... 365/51, 365/205, 49.11, 154, 189.15, 189.02, 189.05, 365/190, 202, 207, 210.13; 327/51, 57; 716/138
See application file for complete search history.

(56) References Cited

U.S. PATENT DOCUMENTS

| 5,822,268 | A | 10/1998 | Kirihata | |
|---|---|---|---|---|
| 5,949,732 | A | 9/1999 | Kirihata | |
| 7,068,528 | B2 | 6/2006 | Won | |
| 7,768,853 | B2 * | 8/2010 | Ahn et al. | 365/203 |
| 7,869,239 | B2 * | 1/2011 | Min et al. | 365/51 |
| 2003/0016059 | A1 * | 1/2003 | Lee et al. | 327/51 |
| 2006/0128110 | A1 * | 6/2006 | Adachi et al. | 438/400 |
| 2006/0181917 | A1 * | 8/2006 | Kang et al. | 365/149 |

FOREIGN PATENT DOCUMENTS

| JP | 08-148572 A | 6/1996 |
|---|---|---|
| JP | 11-126477 A | 5/1999 |
| JP | 11-306755 A | 11/1999 |
| JP | 2003-077277 A | 3/2003 |
| KR | 10-2005-0051349 A | 6/2005 |
| KR | 10-2005-0064709 A | 6/2005 |

* cited by examiner

*Primary Examiner* — Fernando Hidalgo
(74) *Attorney, Agent, or Firm* — Lee & Morse, P.C.

(57) ABSTRACT

A layout structure of bit line sense amplifiers for use in a semiconductor memory device includes first and second bit line sense amplifiers arranged to share and be electrically controlled by a first column selection line signal, and each including a plurality of transistors. In this layout structure, each of the plurality of transistors forming the first bit line sense amplifier is arranged so as not to share an active region with any transistors forming the second bit line sense amplifier.

23 Claims, 5 Drawing Sheets

LAYOUT STRUCTURE OF BIT LINE SENSE AMPLIFIERS FOR A SEMICONDUCTOR MEMORY DEVICE

CROSS REFERENCE TO RELATED APPLICATION

This is a divisional application based on application Ser. No. 12/078,724, filed Apr. 3, 2008 now U.S. Pat. No. 7,869,239, the entire contents of which is hereby incorporated by reference.

BACKGROUND OF THE INVENTION

1. Field of the Invention

Embodiments of the present invention relate to semiconductor memory devices, and more particularly, to a layout structure of bit line sense amplifiers of a semiconductor memory device.

2. Description of the Related Art

In general, in a semiconductor memory device, when a row address is input, a row decoder of a block selected by the row address is activated to enable a word line. A memory cell coupled to the enabled word line is turned on, in order to transmit data to a bit line.

Subsequently, data provided to the bit line is sensed by a bit line sense amplifier, and is transferred to a local input/output line or local data bus (hereinafter, referred to as 'local input/output line') via use of a column selection switch. The data transferred to the local input/output line is transmitted to a global input/output line and is output through an output buffer.

Typically, a semiconductor memory device includes a plurality of bit line sense amplifiers, a plurality of main bit lines, a plurality of sub bit lines, a plurality of column selection switches, a plurality of main local input/output lines, and a plurality of sub local input/output lines. Portions of the bit line sense amplifiers are typically adjacent to one another and share an active region. Sharing an active region may affect performance of the semiconductor memory device. A need, therefore, exists for a semiconductor memory device that addresses one or more limitations of the conventional art.

SUMMARY OF THE INVENTION

Embodiments are therefore directed to a semiconductor memory device including a plurality of bit line sense amplifiers.

It is therefore a feature of an embodiment of the present invention to provide a semiconductor memory device including a plurality of bit line sense amplifiers that may exhibit an improved sensing level.

It is another feature of an embodiment to provide a layout structure of bit line sense amplifiers for use in a semiconductor memory device in which adjacent transistors forming different bit line sense amplifiers that are not controlled by a common column selection line signal share a portion of an active region.

It is yet another feature of an embodiment to provide a layout structure of bit line sense amplifiers for use in a semiconductor memory device in which adjacent transistors forming different bit line sense amplifiers that are controlled by a common column selection line signal are separate.

It is still another feature of an embodiment to provide a layout structure of bit line sense amplifiers for use in a semiconductor memory device in which adjacent bit line sense amplifiers are not controlled by a common column selection line signal.

At least one of the above and other features of the present invention may be realized by providing a layout structure of bit line sense amplifiers for use in a semiconductor memory device, the layout structure including first and second bit line sense amplifiers arranged to share and be electrically controlled by a first column selection line signal, and each including a plurality of transistors. In this layout structure, each of the plurality of transistors forming the first bit line sense amplifier is arranged so as not to share an active region with any transistors forming the second bit line sense amplifier.

Each of the first and second bit line sense amplifiers may include at least two p-channel transistors and at least two n-channel transistors. The structure may include at least one bit line coupled to each of the first and second bit line sense amplifiers, each at least one bit line being electrically coupled to a corresponding local input/output line when the first column selection line signal is enabled.

At least one transistor of the first and second bit line sense amplifiers, and at least one transistor of a third bit line sense amplifier, controlled by a second column selection line signal different from the first column selection line signal, may share a portion of an active region. All transistors of one of the first and second bit lines sense amplifiers may share a portion of an active region with all transistors of the third bit line amplifier.

The first and second bit line sense amplifiers sharing the first column selection line signal may not be adjacent along a column.

At least one of the above and other features of the present invention may be realized by providing a layout structure of bit line sense amplifiers for use in a semiconductor memory device, the layout structure including first and second bit line sense amplifiers electrically controlled by a first column selection line signal, the first and second bit line sense amplifiers being arranged such that the first and second bit line sense amplifiers are not adjacent along a column.

At least one of the first and second bit line sense amplifiers may be disposed along the column adjacent to at least a third bit line sense amplifier controlled by a second column selection line signal different from the first column selection line signal. Transistors forming bit line sense amplifiers adjacent to each other along the column may share a portion of an active region.

At least one of the above and other features of the present invention may be realized by providing a semiconductor memory device including a plurality of transistors arranged to form first and second bit line sense amplifiers, and a first column selection line coupled to the first and second bit line sense amplifiers, wherein an active region of any transistor of the first bit line sense amplifier is separate from an active region of any transistor of the second bit line sense amplifier.

Each of the first and second bit line sense amplifiers may include at least two p-channel transistors and at least two n-channel transistors.

The device may include at least one bit line coupled to each of the first and second bit line sense amplifiers, each at least one bit line being electrically coupled to a corresponding local input/output line when the first column selection line signal is enabled.

At least one transistor of the first and second bit line sense amplifiers, and at least one transistor of a third bit line sense amplifier, controlled by a second column selection line signal different from the first column selection line signal, may share a portion of an active region. All transistors of one of the first and second bit lines sense amplifiers may share a portion of an active region with all transistors of the third bit line amplifier.

The first and second bit line sense amplifiers sharing the first column selection line signal may not be adjacent along a column.

At least one of the above and other features of the present invention may be realized by providing a layout method of bit line sense amplifiers for use in a semiconductor memory device, the method including arranging adjacent transistors in different bit line sense amplifiers controlled by a common selection line signal to be separate, and arranging adjacent transistors in different bit line sense amplifiers controlled by different selection line signals to share a portion of an active region.

BRIEF DESCRIPTION OF THE DRAWINGS

The above and other features and advantages of the present invention will become more apparent to those of ordinary skill in the art by describing in detail exemplary embodiments thereof with reference to the attached drawings, in which.

DETAILED DESCRIPTION OF THE INVENTION

Korean Patent Application No. 2007-0033135, filed on Apr. 4, 2007, in the Korean Intellectual Property Office, and entitled: "Layout Structure of Bit Line Sense Amplifiers for Semiconductor Memory Device," is incorporated by reference herein in its entirety.

Embodiments will now be described more fully hereinafter with reference to the accompanying drawings. The invention may, however, be embodied in different forms and should not be construed as limited to the embodiments set forth herein. Rather, these embodiments are provided so that this disclosure will be thorough and complete, and will fully convey the scope of the invention to those skilled in the art.

In the figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Figure 1:
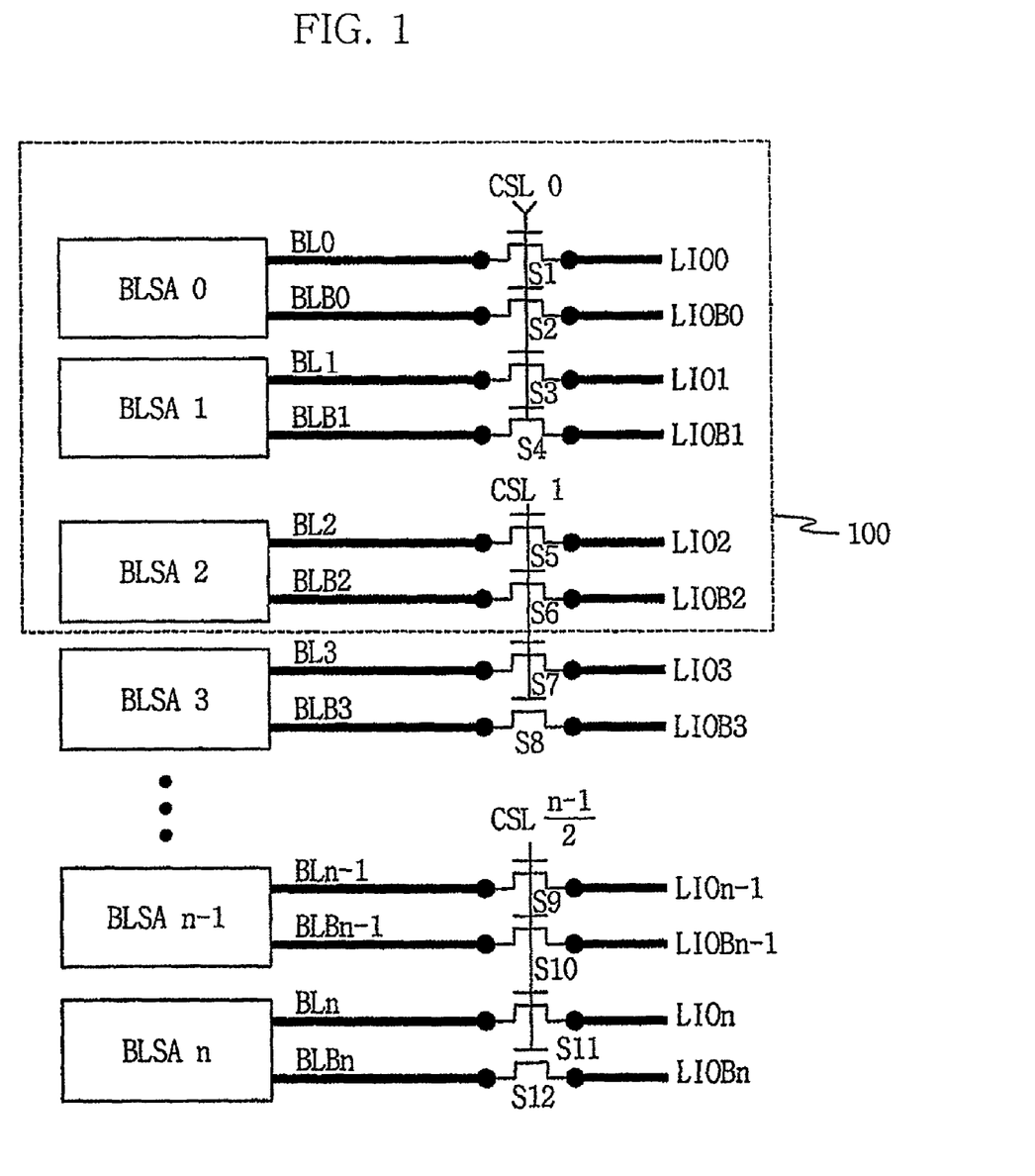
FIG. 1 illustrates a core structure of semiconductor memory device according to an embodiment.

As illustrated in FIG. 1, a general semiconductor memory device may include a plurality of bit line sense amplifiers BLSA0 to BLSAn (hereinafter, referred to generically as 'BLSA'), a plurality of main bit lines BL0 to BLn (hereinafter, referred to generically as 'BL'), a plurality of sub bit lines BLB0 to BLBn (hereinafter, referred to generically as 'BLB'), a plurality of column selection switches S1 to S12, a plurality of main local input/output lines LIO0 to LIOn (hereinafter, referred to generically as 'LIO'), a plurality of sub local input/output lines LIOB0 to LIOBn (hereinafter, referred to generically as 'LIOB'), and a plurality of column selection lines CSL0 to CSL(n−1)/2 (hereinafter, referred to generically as 'CSL').

Each bit line sense amplifier BLSA may be coupled to a bit line pair including one main bit line BL and one sub bit line BLB. The main bit line BL and the sub bit line BLB may be coupled to a main local input/output line LIO and the sub local input/output line LIOB, respectively. The main bit line BL may be coupled to a main local input/output line LIO via a column selection switch S. Additionally, the sub bit line BLB may be coupled to a sub local input/output line LIOB via another column selection switch S. For example, as illustrated in FIG. 1, a zeroth bit line sense amplifier BLSA0 is coupled with a zeroth main bit line BL0 and a zeroth sub bit line BLB0, which, in turn are coupled with a zeroth main local input/output line LIO0 and a zeroth sub local input/output line LIOB0 through column selection switches S1 and S2 controlled by a zeroth column selection line signal CSL0.

Thus, one or more column selection switches S coupled to a main bit line BL and a sub bit line BLB of a single bit line sense amplifier BLSA may be controlled by a single column selection line CSL. In one embodiment, a single column selection line CSL may be coupled to two or more bit line sense amplifiers BLSA. In other words, when one column selection line CSL is enabled, at least two bit line sense amplifiers BLSA may be electrically connected to local input/output line pairs LIO, LIOB. As further illustrated in FIG. 1, at least four column selection switches, e.g., S1 to S4, may be controlled by one column selection line signal, e.g., CSL0. Further, in this embodiment, the two or more bit line sense amplifiers BLSA that are coupled to a single column selection line CSL may not share an active area of a semiconductor memory device, as will be explained in more detail later.

Figure 2:
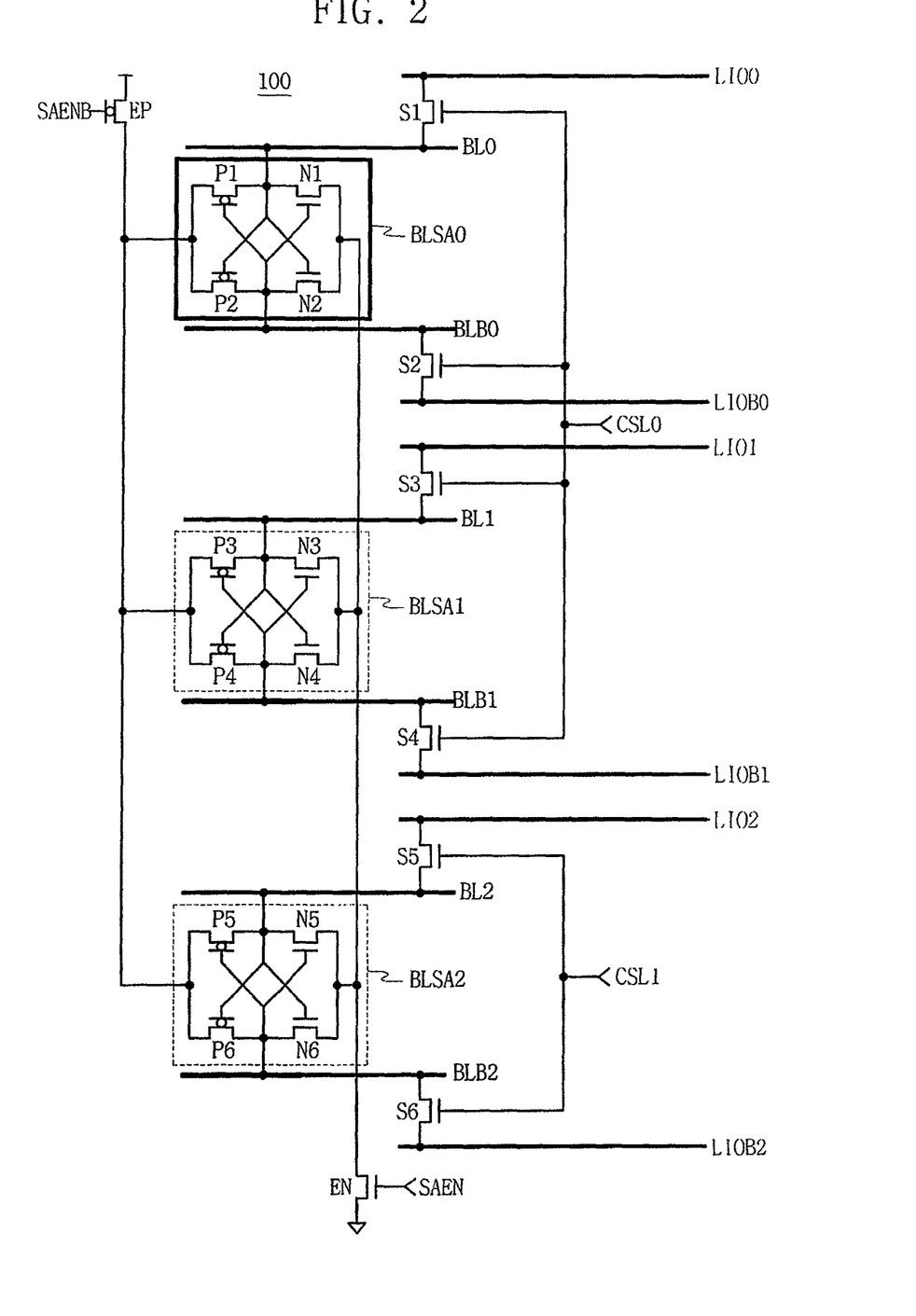
FIG. 2 illustrates a general circuit diagram of a connection structure according to an embodiment.

FIG. 2 illustrates a general circuit diagram of a connection structure 100 shown in FIG. 1. The connection structure 100 is between bit line sense amplifiers BLSA0 and BLSA1 sharing the zeroth column selection line signal CSL0, and local input/output line pairs LIO0, LIOB0 and LIO1, LIOB1, and between a portion of bit line sense amplifier BLSA2 and local input/output line pair LIO2, LIOB2, which are commonly controlled by a first column selection line signal CSL1, as illustrated to in FIG. 1.

As illustrated in FIG. 2, the zeroth bit line sense amplifier BLSA0 may include two PMOS transistors P1 and P2, and two NMOS transistors N1 and N2, between a zeroth main bit line BL0 and a zeroth sub bit line BLB0. As well known in the art, the transistors P1, P2, N1 and N2 may form two inverters, which, in turn, form a latch. The zeroth bit line BL0 is coupled to zeroth main local input/output line LIO0 through a first column selection switch S1, and the zeroth sub bit line BLB0 is coupled to zeroth sub local input/output line LIOB0 through a second column selection switch S2.

A first bit line sense amplifier BLSA1 may include two PMOS transistors P3 and P4, and two NMOS transistors N3 and N4, between a first main bit line BL1 and a first sub bit line BLB1. Again, the transistors P3, P4, N3 and N4 have a structure two inverters form a latch. The first main bit line BL1 is coupled to a first main local input/output line LIO1 through a third column selection switch S3, and the first sub bit line BLB1 is coupled to first sub local input/output line LIOB1 through a fourth column selection switch S4.

Each of the first to fourth column selection switches S1, S2, S3 and S4 may be an NMOS transistor, and may all be controlled commonly with the zeroth column selection line signal CSL0.

A second bit line sense amplifier BLSA2 may include two PMOS transistors P5 and P6, and two NMOS transistors N5 and N6, between a second main bit line BL2 and a second sub bit line BLB2. Again, the transistors P5, P6, N5 and N6 form a latch.

The second main bit line BL2 is coupled to a second main local input/output line LIO2 through a fifth column selection switch S5, and the second sub bit line BLB2 is coupled to a second sub local input/output line LIOB2 through a sixth column selection switch S6.

Enable transistors EP and EN to enable other bit line sense amplifiers BLSA may be adapted herein.

Figure 3:
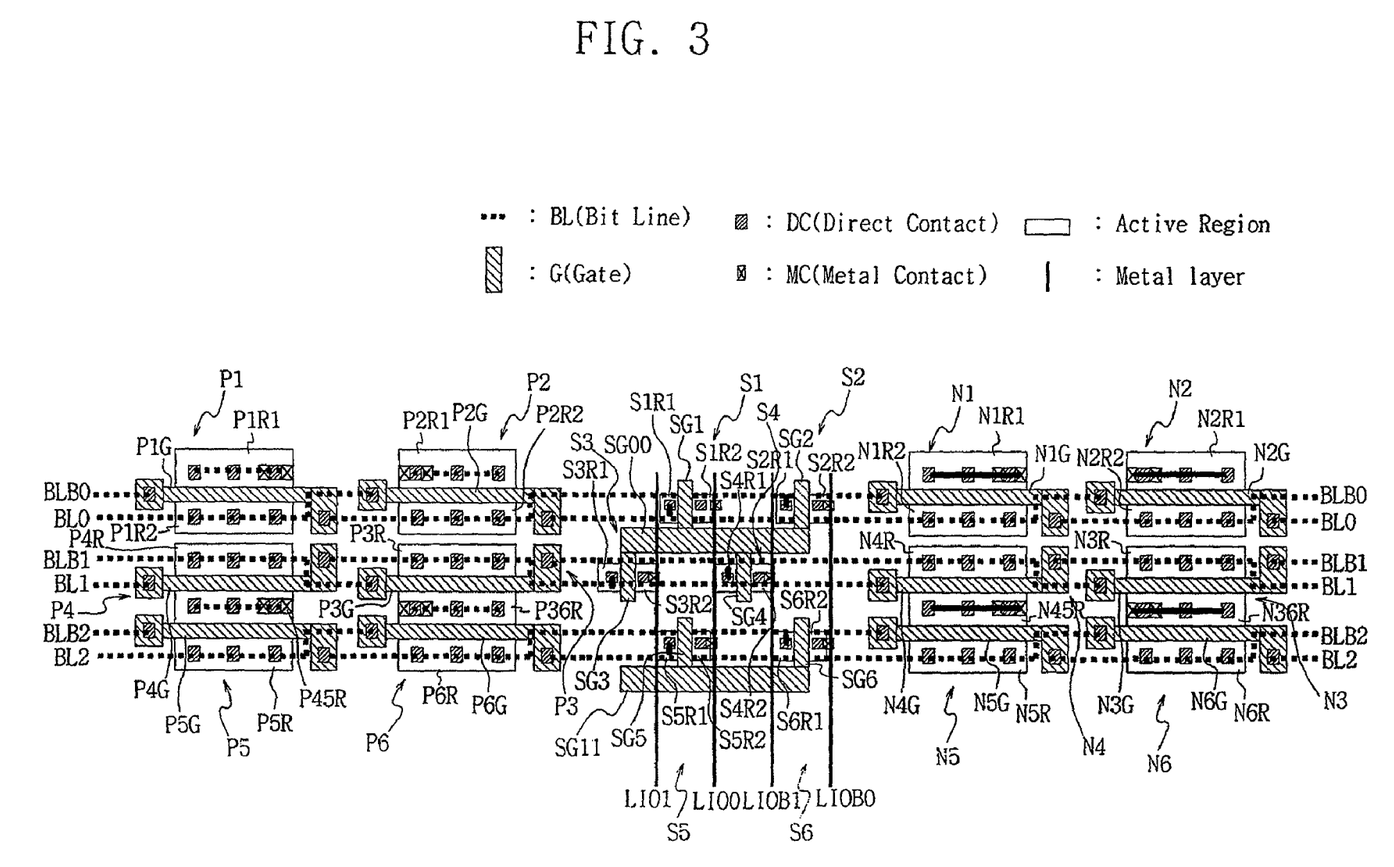
FIG. 3 illustrates a layout structure of a semiconductor memory device according to an embodiment.

Referring now to FIG. 3, a semiconductor memory device layout is illustrated. The semiconductor memory device may include a plurality of p-channel transistors P1 to P6, each coupled to a bit line BL and a sub bit line BLB, and a plurality of n-channel transistors N1 to N6, each coupled to a bit line BL and a sub bit line BLB. One or more of the n-channel transistors and the p-channel transistors may form a bit line sense amplifier BLSA. For example, although the scope of the present invention is not so limited, the p-channel transistors P1 and P2, in combination with the n-channel transistors N1 and N2, may form the bit line sense amplifier BLSA0. Furthermore, in this example, the p-channel transistors P3 and P4, in combination with the n-channel transistors N3 and N4, may form the bit line sense amplifier BLSA1, and the p-channel transistors P5 and P6, in combination with the n-channel transistors N5 and N6, may form the bit line sense amplifier BLSA2.

The p-channel transistor P1 may include an active area. The active area may be divided by a gate line P1G into a plurality of conductive areas P1R1 and P1R2. The conductive areas P1R1 and P1R2 may include a source area and a drain area.

The p-channel transistor P1 may be adjacent to the p-channel transistor P4. As shown in FIG. 2, in one embodiment, the p-channel transistor P1 and the p-channel transistor P4 may be controlled by the same column selection line, e.g., CSL0. As a result, in the layout illustrated in FIG. 3, the p-channel transistor P4 may not share an active area with the p-channel transistor P1. The p-channel transistor P1 may, however, share a portion of an active area, i.e., conductive area P1R1 or conductive area P1R2, with other p-channel transistors (not shown) that are not controlled by the same column selection line CSL, for example.

The p-channel transistor P4 may have a structure similar to the p-channel transistor P1. For example, the p-channel transistor P4 may include a gate line P4G crossing an active area to divide the active area into conductive areas P4R and P45R. As noted above, the p-channel transistor P4 and the p-channel transistor P1 adjacent thereto may not share an active area, such as conductive areas P1R1 and P1R2 and conductive areas P4R and P45R. The p-channel transistor P4 may, however, share a portion of an active area with other p-channel transistors not controlled by the same column selection line CSL. For example, the p-channel transistor P4 may share a portion of conductive area P45R with the p-channel transistor P5 adjacent to the p-channel transistor P4. The p-channel transistor P5 may have a similar structure as the p-channel transistor P1, and may include a gate line P5G crossing a conductive area to obtain conductive areas P45R and P5R.

Continuing with this embodiment, the p-channel transistor P2 may include an active area. The active area may be divided by a gate line P2G into a plurality of conductive areas P2R1 and P2R2. The conductive areas may include a source area and a drain area. The p-channel transistor P2 may be adjacent to the p-channel transistor P3. In one embodiment, the p-channel transistor P2 and the p-channel transistor P3 may be controlled by the same column selection line CSL. As a result, in the layout illustrated in FIG. 2, the p-channel transistor P2 and the p-channel transistor P3 may not share an active area. The p-channel transistor P2 may, however, share a portion of an active area, i.e., conductive area P2R1 with other p-channel transistors (not shown) that may not be controlled by the same column selection line (not shown), for example.

The p-channel transistor P3 may have a structure similar to the p-channel transistor P2. For example, the p-channel transistor P3 may include a gate line P3G crossing an active area to divide the active area into conductive areas P3R and P36R.

As noted above, the p-channel transistor P3 and the p-channel transistor P2 adjacent thereto may not share an active area. The p-channel transistor P3 may, however, share a portion of an active area with other p-channel transistors not controlled by the same column selection line CSL. For example, the p-channel transistor P3 may share a portion of conductive area P36R with the p-channel transistor P6 adjacent to the p-channel transistor P3. The p-channel transistor P6 may have a similar structure as the p-channel transistor P2, and may include a gate line P6G crossing an active area to obtain conductive areas P6R and P36R.

In short, each p-channel transistor P1 to P6 may be arranged to not share an active area with other p-channel transistors if controlled by a common column selection line CSL0 (shown in FIG. 2). At least two mutually neighboring transistors P4 and P5, P3 and P6 may share a portion of active area, but may be controlled by mutually different column selection lines, i.e., CSL0 and CSL1 (shown in FIG. 1). That is, when transistors are adjacent to one another and controlled by different column selection lines, the transistors may share a portion of an active area.

The semiconductor memory device may include four column selection transistors S1, S2, S3, and S4. The column selection transistors S1, S2, S3, and S4 may operate as column selection switches and may be controlled by a column selection line CSL0. The column selection transistors S1, S2, S3, and S4 may respectively include interposed separate gate lines SG1, SG2, SG3, and SG4 that individually extend upward or downward from a common gate line SG00. The common gate line SG00 may include an upper part and a lower part. In the upper part of the common gate line SG00, the column selection transistors S1 and S2 may be disposed adjacent to one another, and in the lower part of the common gate line SG00, the column selection transistors S3 and S4 may be disposed adjacent to one another.

The column selection transistors S5 and S6 may be disposed adjacent to the column selection transistors S1, S2, S3, and S4. The column selection transistors S5 and S6 may be controlled by a column selection line CSL1. The column selection transistors S5 and S6 may be disposed adjacent to one another, and may respectively include interposed separate gate lines SG5 and SG6 extending from a common gate line SG11. The column selection transistors S5 and S6 may have a similar structure as the column selection transistors S1 and S2.

The plurality of n-channel transistors N1 to N6 may be disposed adjacent to the column selection transistors S1 to S6. The n-channel transistor N1 may be disposed adjacent to column selection transistor S2, and may have a channel region. The n-channel transistor N1 may include a gate line N1G crossing an active area to form conductive areas N1R1 and N1R2. The conductive areas may include a source region and a drain region.

The n-channel transistor N1 may be adjacent to the n-channel transistor N4. In one embodiment the n-channel transistor N1 and the n-channel transistor N4 may be controlled by the same column selection line CSL0 (shown in FIG. 1). As a result, in the layout illustrated in FIG. 3, the n-channel transistor N1 and the n-channel transistor N4 may not share the active areas N1R1 and N1R2. The n-channel transistor N1 may, however, share a portion of an active area, i.e., N1R1, with other n-channel transistors (not shown) that are not be controlled by the same column selection line CSL, for example.

The n-channel transistor N4 may have a structure similar to the n-channel transistor N1. For example, the n-channel transistor N4 may include a gate line N4G crossing a conductive area to divide the conductive area into active areas N4R and N45R.

As noted above, the n-channel transistor N4 and the n-channel transistor N1 adjacent thereto may not share an active area. The n-channel transistor N4 may, however, share a portion of conductive area with other n-channel transistors not controlled by the same column selection line CSL. For example, the n-channel transistor N4 may share a portion of active area N45R with the n-channel transistor N5 adjacent to the n-channel transistor N4. The n-channel transistor N5 may have a similar structure as the n-channel transistor N1, and may include a gate line N5G crossing a conductive area to obtain active areas N45R and N5R.

Continuing with this embodiment, the n-channel transistor N2 may include a conductive area. The conductive area may be divided by a gate line N2G into a plurality of active areas N2R1 and N2R2. The conductive areas may include a source area and a drain area. The n-channel transistor N2 may be adjacent to n-channel transistor N3. In one embodiment the n-channel transistor N2 and the n-channel transistor N3 may be controlled by the same column selection line CSL0. As a result, in the layout illustrated in FIG. 3, the n-channel transistor N2 and the n-channel transistor N3 may not share the active areas N2R1 and N2R2. The n-channel transistor N2 may, however, share a portion of an active area, i.e., N2R1, with other n-channel transistors (not shown) that may not be controlled by the same column selection line CSL, for example.

The n-channel transistor N3 may be disposed adjacent to the n-channel transistor N2. The n-channel transistor N3 may have a structure similar to the n-channel transistor N2. For example, the n-channel transistor N3 may include a gate line N3G crossing a conductive area to divide the conductive area into active areas N3R and N36R.

As noted above, the n-channel transistor N3 and the n-channel transistor N2 adjacent thereto may not share an active area. The n-channel transistor N3 may, however, share an active area with other n-channel transistors not controlled by the same column selection line CSL. For example, the n-channel transistor N3 may share a portion of active area N36R with the n-channel transistor N6 adjacent to the n-channel transistor N3. The n-channel transistor N6 may have a similar structure as the n-channel transistor N2, and may include a gate line N6G crossing a conductive area to obtain active areas N36R and N6R.

In short, each n-channel transistor N1 to N6 is disposed to not share an active area with other n-channel transistors N1 to N6 if controlled by a common column selection line signal CSL. At least two mutually neighboring transistors N4 and N5, N3 and N6 may share a portion of active area, but may be controlled by mutually different column selection line signals CSL, e.g., CSL0 and CSL1. That is, when transistors are adjacent to one another and controlled by different column selection line signals, the transistors may share a portion of an active area.

Further, one or more direct contacts (DC) may be disposed on one or more of the gate lines P1G to P6G, S1G to S6G, N1G to N6G of the transistors P1 to P6, S1 to S6, N1 to N6 and the conductive areas P1R1, P1R2, P2R1, P2R2, P3R1, P3R, P4R, P45R, P36R, S1R1, S1R2, S2R1, S2R2, S3R1, S3R2, S4R1, S4R2, S5R1, S5R2, S6R1, S6R2, N1R1, N1R2, N2R1, N2R2, N3R, N4R, N45R and N36R. The DCs may form an electrical connection between the transistors P1 to P6, S1 to S6, N1 to N6, and bit line BL, BLB, and for a wiring between the transistors P1 to P6, S1 to S6, and N1 to N6. Additionally, one or more metal layers may be included in the semiconductor memory device layout illustrated in FIG. 3.

Further, the semiconductor device layout of FIG. 3 may include bit lines BL0, BLB0, BL1, BLB1, BL2 and BLB2. The bit lines BL0, BLB0, BL1, BLB1, BL2, BLB2 may include not only bit lines BL, BLB shown in FIG. 3, but may also include a wiring line (not shown) extended from the bit lines BL, BLB and coupled with respective transistors P1 to P6, S1 to S6, N1 to N6. For example, the zeroth sub bit line BLB0 may be connected with the gate line P1G of the p-channel transistor P1, the second conductive area P2R2 of the p-channel transistor P2, the first conductive area S2R1 of the column selection transistor S2, the gate line N1G of the n-channel transistor N1, and the second conductive area N2R2 of the n-channel transistor N2. Further, the zeroth main bit line BL0 may be connected with the second conductive area P1R2 of the p-channel transistor P1, the gate line P2G of the p-channel transistor P2, the first conductive area S2R1 of the column selection transistor S2, the second conductive area N1R2 of the n-channel transistor N1, and the gate line N2G of the n-channel transistor N2.

One or more metal contact (MC) for an electrical connection with the enable transistor EN, EP (shown in FIG. 1), may be included in the first conductive area P1R1 of the p-channel transistor P1, the first conductive area P2R1 of the p-channel transistor P2, the first conductive area N1R1 of the n-channel transistor N1, and the first conductive area N2R1 of the n-channel transistor N2.

The first sub bit line BLB1 may be coupled with the conductive area P4R of the p-channel transistor P4, the gate line P3G of the p-channel transistor P3, the first conductive area S4R1 of the column selection transistor S4, the conductive area N4R of the n-channel transistor N4, and the gate line N3G of the n-channel transistor N3. The first main bit line BL1 may be coupled with the gate line P4G of the p-channel transistor P4, the conductive area P3R of the p-channel transistor P3, the first conductive area S3R1 of the column selection transistor S3, the gate line N4G of the n-channel transistor N4, and the conductive area N3R of the n-channel transistor N3.

One or more pads or metal contacts MC to form an electrical connection with the enable transistor EN, EP (shown in FIG. 1) may be included in the common conductive area P45R of the p-channel transistors P4 and P5, the common conductive area P36R of the p-channel transistors P3 and P6, the common conductive area N45R of the n-channel transistors N4 and N5, and the common conductive area N36R of the n-channel transistors N3 and N6.

A layout structure of the second main bit line BL2 and the second sub bit line BLB2 may be similar to that of the zeroth main bit line BL0 and the zeroth sub bit line BLB0. The second sub bit line BLB2 may be coupled with the gate line P5G of the p-channel transistor P5, the conductive area P6R of the p-channel transistor P6, the first conductive area S6R1 of the column selection transistor S6, the gate line N5G of the n-channel transistor N5, and the conductive area N6R of n-channel transistor N6. The second main bit line BL2 may be coupled with the conductive area P5R of the p-channel transistor P5, the gate line P6G of the p-channel transistor P6, the first conductive area S5R1 of the column selection transistor S5, the conductive area N5R of the n-channel transistor N5, and the gate line N6G of the n-channel transistor N6.

Subsequently, metal contacts MC for a metal layer may be formed, and may be adapted to form an electrical connection with a metal layer formed in an upper part thereof. The metal layer may have a layout including local input/output lines and sub local input/output lines LIO and LIOB. For example, on each of the second conductive areas S1R2, S2R2, S3R2 and S4R2 of the column selection transistors S1, S2, S3 and S4, one or more metal contacts MC may be disposed and may form an electrical connection with local input/output line LIO and sub local input/output line LIOB.

Consequently, a zeroth main local input/output line LIO0 may be electrically connected to the second conductive area S1R2 of the column selection transistor S1, and the zeroth sub local input/output line LIOB0 may be electrically connected to the second conductive area S2R2 of the column selection transistor S2. Further, a first main local input/output line LIO1 may be electrically connected to the second conductive area S3R2 of the column selection transistor S3, and the first sub local input/output line LIOB1 may be electrically connected to the second conductive area S4R2 of the column selection transistor S4. Although not illustrated, a second main local input/output line LIO2 may be electrically connected to the second conductive area S5R2 of column selection transistor S5, and the second sub local input/output line LIOB2 may be electrically connected to the second conductive area S6R2 of column selection transistor S6.

Figure 4:
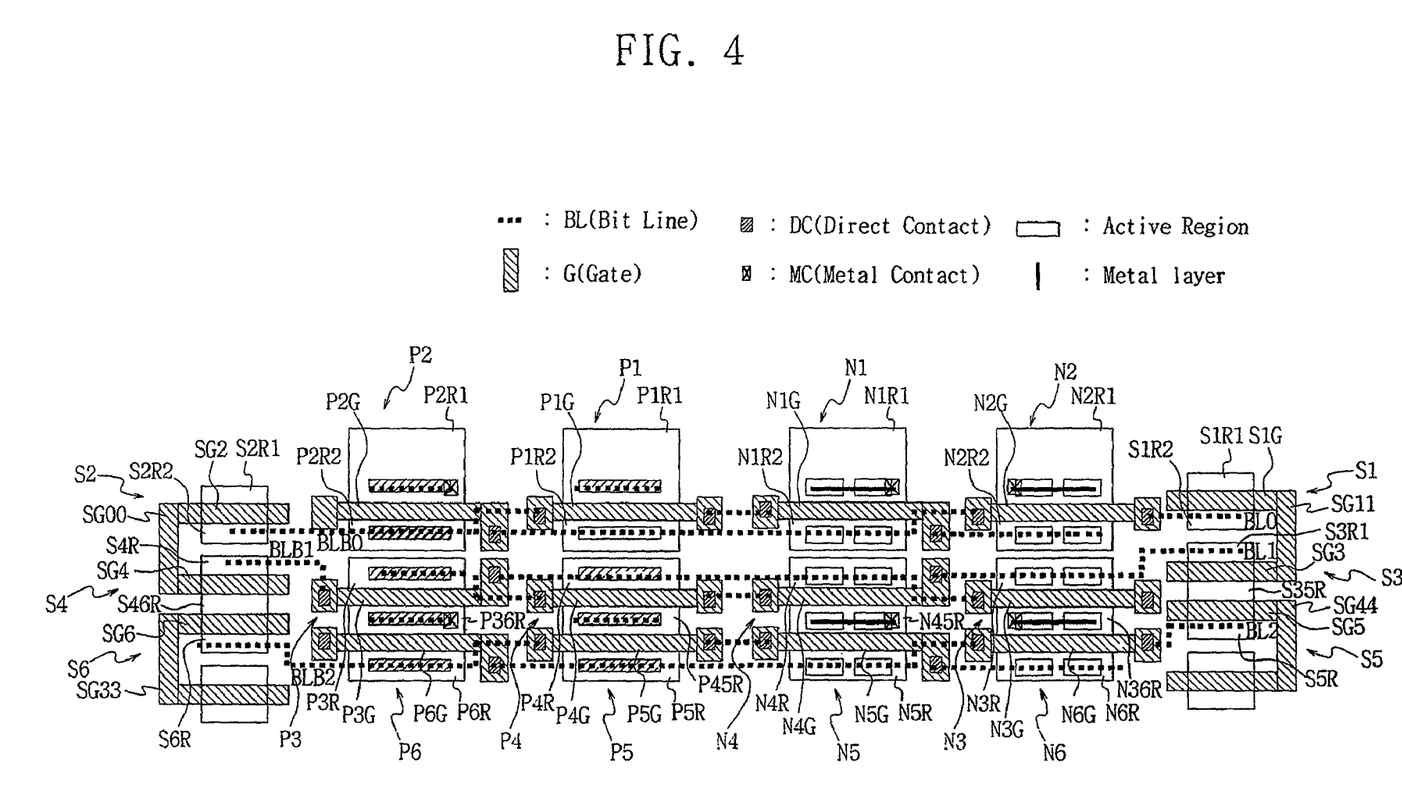
FIG. 4 illustrates a layout structure of a semiconductor memory device according to another embodiment.

Referring now to FIG. 4, another semiconductor memory device layout is illustrated. The semiconductor memory device may include the plurality of p-channel transistors P1 to P6 and the plurality of n-channel transistors N1 to N6. The p-channel transistors P1 to P6 and the n-channel transistors N1 to N6 may each include an active area, and one or more of the p-channel transistors P1 to P6 and the n-channel transistors N1 to N6 may form a bit line sense amplifier BLSA. For example, although the scope of the present invention is not so limited, the p-channel transistors P1 and P2 in combination with the n-channel transistors N1 and N2 may form the bit line sense amplifier BLSA0. Furthermore, in this example, the p-channel transistors P3 and P4 in combination with the n-channel transistors N3 and N4 may form the bit line sense amplifier BLSA1, and the p-channel transistors P5 and P6 in combination with the n-channel transistors N5 and N6 may form the second bit line sense amplifier BLSA2. Further, column selection transistors S1 to S6 may be coupled to one or more of the transistors P1 to P6 and the n-channel transistors N1 to N6. In FIG. 4, the column selection transistor S2 may include a channel region. Another column selection transistor S4 may include a channel region adjacent to the channel region of the column selection transistor S2. A gate line SG4 of the column selection transistor S4 may be electrically connected to a gate line SG2 through the common gate line SG00.

The column selection transistor S6 may have a similar structure as the column selection transistor S2. The column selection transistor S6 may share a conductive area S46R with the column selection transistor S4 and may be arranged adjacent to the column selection transistor S4. Gate line SG6 of the column selection transistor S6 may be disposed in parallel with the gate line SG2. Gate line SG6 may be electrically connected to a common gate line SG33 that extends from one side of the gate line SG6 of the column selection transistor S6.

The p-channel transistor P2 may include a channel region. The p-channel transistor P2 may be adjacent to the column selection transistor S2. The p-channel transistor P2 may include the gate line P2G that crosses an active area of the p-channel transistor P2 to form conductive areas P2R1 and P2R2. The conductive areas may include a source area and a drain area. The p-channel transistor P2 and the p-channel transistor P3 arranged adjacent to the p-channel transistor P2 may not share an active area. The p-channel transistor P2 may, however, share a portion of active area, e.g., the conductive area P2R1, with other p-channel transistors (not shown). The other p-channel transistors may be controlled by a column selection line CSL that does not control the p-channel transistor P2, for example.

The p-channel transistor P3 may have a structure similar to the p-channel transistor P2. The p-channel transistor P3 may include the gate line P3G crossing a active area of the p-channel transistor to form conductive areas P3R and P36R. The p-channel transistor P3 and the p-channel transistor P2 may not share an active area. The p-channel transistor P3 may, however, share a portion of a conductive area of other p-channel transistors that are not be controlled by the same column selection line CSL. For example, the p-channel transistor P3 may share a portion of conductive area P36R with the p-channel transistor P6. The p-channel transistor P6 may be controlled by a different column selection line than the p-channel transistor P3. Further, the p-channel transistor P6 may have the same structure as the p-channel transistor P2, and may include the gate line P6G crossing a active area of the p-channel transistor P6 to form conductive areas P6R and P36R.

The p-channel transistor P1 may include a channel region. The p-channel transistor P1 may include the gate line P1G crossing an active area of the p-channel transistor P1 to form conductive areas P1R1 and P1R2. The conductive areas P1R1 and P1R2 may be source and drain areas. The p-channel transistor P1 and p-channel transistor P4 may be adjacent to one another and may not share the conductive areas P1R1 and P1R2 of the p-channel transistor P1. The p-channel transistor P1 may, however, share a portion of conductive area P1R1, with other p-channel transistors (not shown) not controlled by the same column selection line CSL.

The p-channel transistor P4 may have a similar structure to the p-channel transistor P1. The p-channel transistor P4 may include the gate line P4G crossing an active area of the p-channel transistor P4 to form conductive areas P4R and P45R. The p-channel transistors P4 and P1 may not share an active area. The p-channel transistor P4 may, however, share a portion of conductive area with other p-channel transistor that may not be controlled by the same column selection line. For example, the p-channel transistor P4 may share a portion of the conductive area P45R with the p-channel transistor P5. The p-channel transistors P4 and P5 may be controlled by different column selection lines CSL, for example. Further, the p-channel transistor P5 may have a similar structure as the p-channel transistor P1, and may include the gate line P5G that divides an active area of the p-channel transistor P5 to form conductive areas P5R and P45R.

In short, although not illustrated in detail, the p-channel transistors P1-P6 may be arranged so as to not share an active area with one another when they share a common column selection line signal, i.e., CSL0. Alternatively, if the p-channel transistors P1 to P6 are controlled by mutually different column selection line signals, i.e., CSL0 and CSL1, at least two mutually neighboring transistors P4 and P5, P3 and P6 may share a portion of active area. That is, when transistors are adjacent to one another and controlled by different column selection lines, the transistors may be arranged to share a portion of the active area.

The n-channel transistor N2 may include a channel region. The n-channel transistor N2 may be adjacent to column selection transistor S1. The n-channel transistor N2 may include the gate line N2G that crosses a conductive area of n-channel transistor N2 to form areas active areas N2R1 and N2R2. The active areas may include a source area and a drain area. The n-channel transistor N2 and the n-channel transistor N3 arranged adjacent to the n-channel transistor N2 may not share an active area. The n-channel transistor N2 may, however, share a portion of active area, e.g., N2R1, with other n-channel transistors (not shown). The other n-channel transistors may be controlled by a column selection line (not shown) that does not control the n-channel transistor N2, for example.

The n-channel transistor N3 may be disposed adjacent to the n-channel transistor N2. The n-channel transistor N3 may have a structure similar to the n-channel transistor N2. The n-channel transistor N3 may include a gate line N3G crossing a conductive area of the n-channel transistor to form active areas N3R and N36R. The n-channel transistor N3 and the n-channel transistor N2 may not share the active areas N3R and N36R. The n-channel transistor N3 may, however, share a portion of an active area of other n-channel transistors that may not be controlled by the same column selection line (not shown). For example, the n-channel transistor N3 may share a portion of conductive area, N36R with the n-channel transistor N6. The n-channel transistor N6 may be controlled by a different column selection line (not shown) than the n-channel transistor N3. Further, the n-channel transistor N6 may have the same structure as the n-channel transistor N2, and may include a gate line N6G crossing a conductive area of the n-channel transistor N6 to form active areas N6R and N36R.

The n-channel transistor N1 may include a channel region. The n-channel transistor N1 may include the gate line N1G crossing an active area of the n-channel transistor N1 to form conductive areas N1R1 and N1R2. The active areas N1R1 and N1R2 may include a source area and a drain area. The n-channel transistor N1 and n-channel transistor N4 may be adjacent to one another and may not share the active areas N1R1 and N1R2 of n-channel transistor N1. The n-channel transistor N1 may, however, share a portion of an active area, e.g., the conductive area N1R1, with other n-channel transistors (not shown) not controlled by the same column selection line (not shown).

The n-channel transistor N4 may be disposed adjacent to the n-channel transistor N1. The n-channel transistor N4 may have a similar structure as the n-channel transistor N1. The n-channel transistor N4 may include the gate line N4G crossing an active area of the n-channel transistor N4 to form conductive areas N4R and N45R. The n-channel transistors N4 and N1 may be adjacent to one another and may not share an active area. The n-channel transistor N4 may, however, share a portion of an active area with other n-channel transistors not be controlled by the same column selection line. For example, the n-channel transistor N4 may share a portion of the active area N45R with the n-channel transistor N5. The n-channel transistors N4 and N5 may be controlled by different column selection lines (not shown), for example. Further, the n-channel transistor N5 may have a similar structure as the n-channel transistor N1, and may include the gate line N5G crossing an active area of the n-channel transistor N5 to form conductive areas N5R and N45R.

In short, although not illustrated in detail, the n-channel transistors N1 to N6 may be disposed so as to not share an active area with one another when shared by a common column selection line, e.g., CSL0. Alternatively, if the n-channel transistors N1 to N6 are controlled by mutually different column selection lines, e.g., CSL0 and CSL1, at least two mutually neighboring transistors N4 and N5, N3 and N6 may share a portion of active area. That is, when transistors are adjacent to one another and controlled by different column selection lines, the transistors may be share an active area.

The column selection transistors S1 to S6 may operate as column selection switches. A column selection transistor S1 may include a channel region and may be adjacent to the n-channel transistor N2. The column selection transistor S3 may include a channel region and may be adjacent to the column selection transistor S1. The gate line SG3 of the column selection transistor S3 may be electrically connected to a gate line SG1 via a common gate line SG11 extended from one side of the gate line SG1 of the column selection transistor S1, and may be disposed in parallel with the gate line SG1 of the column selection transistor S1. The common gate lines SG11 and SG00 may be electrically connected to each other so that the column selection transistors S1, S2, S3 and S4 may receive a column selection line signal via a gate thereof.

The column selection transistor S5 may include the same structure as the column selection transistor S1, and may be adjacent to the transistor S3. The column selection transistor S5 may share one conductive area S35R with the column selection transistor S3. Gate line SG5 of the column selection transistor S5 may be disposed in parallel with the gate line SG3. Gate line SG5 may be electrically connected to a common gate line SG44 that extends from one side of the gate line SG5 of the column selection transistor S5.

Further, direct contacts (DC) may be disposed on gate lines P1G to P6G, S1G to S6G, N1G to N6G of the transistors P1 to P6, 51 to S6, N1 to N6, and on the conductive areas P1R1, P1R2, P2R1, P2R2, P3R1, P3R, P4R, P45R, P36R, N1R1, N1R2, N2R1, N2R2, N3R, N4R, N45R, N36R, S2R1, S46R, S1R1, S1R2, S3R1 and S35R. The DCs are adapted to form an electrical connection between the transistors P1 to P6, S1 to S6, N1 to N6 and bit line BL, BLB, and for a wiring between the transistors P1 to P6, S1 to S6, N1 to N6. Further, bit lines BL0, BLB0, BL1, BLB1, BL2 and BLB2 may be disposed on the semiconductor memory device and may include not only bit line BL, BLB as illustrated in FIG. 4, but may also include a wiring line extended from the bit line BL, BLB and directly connected with respective transistors P1 to P6, S1 to S6, N1 to N6. The sub bit line BLB0 may be coupled to the second conductive area S2R2 of the column selection transistor S2, the second conductive area P2R2 of the p-channel transistor P2, the gate line P1G of the p-channel transistor P1, the gate line N1G of the n-channel transistor N1, and the second conductive area N2R2 of the n-channel transistor N2.

The main bit line BL0 may be connected with the gate line P2G of the p-channel transistor P2, the second conductive area P1R2 of the p-channel transistor P1, the second conductive area N1R2 of the n-channel transistor N1, the gate line N2G of the n-channel transistor N2, and the second conductive area S1R2 of the column selection transistor S1. The first conductive area P2R1 of the p-channel transistor P2, the first conductive area P1R1 of the p-channel transistor P1, the first conductive area N1R1 of the n-channel transistor N1, and the first conductive area N2R1 of the n-channel transistor N2 may include a pad for an electrical connection with enable transistor EN, EP may be disposed, or a metal line may be disposed after a layout of metal contact MC.

First sub bit line BLB1 may be disposed to be coupled with conductive area S4R of column selection transistor S4, gate line P3G of the p-channel transistor P3, conductive area P4R of the p-channel transistor P4, conductive area N4R of the n-channel transistor N4, and gate line N3G of the n-channel transistor N3.

The first main bit line BL1 may be disposed to be coupled with conductive area P3R of the p-channel transistor P3, gate line P4G of the p-channel transistor P4, gate line N4G of the n-channel transistor N4, conductive area N3R of the n-channel transistor N3, and first conductive area S3R1 of the column selection transistor S3.

In a common conductive area P45R of the p-channel transistors P4 and P5, a common conductive area P36R of the p-channel transistors P3 and P6, a common conductive area N45R of the n-channel transistors N4 and N5, and a common conductive area N36R of the n-channel transistors N3 and N6, a pad for an electrical connection with enable transistor EN, EP may be disposed, or a metal line may be disposed after a layout of metal contact MC.

A layout structure of the second main bit line BL2 and the second sub bit line BLB2 is the same as that of the zeroth main bit line BL0 and the zeroth sub bit line BLB0. The second sub bit line BLB2 is disposed to be coupled with conductive area S6R of the column selection transistor S6, conductive area P6R of the p-channel transistor P6, gate line P5G of the p-channel transistor P5, gate line N5G of the n-channel transistor N5, and conductive area N6R of the n-channel transistor N6.

Then, the second main bit line BL2 is disposed to be coupled with the gate line P6G of the p-channel transistor P6, the conductive area P5R of the p-channel transistor P5, the conductive area N5R of the n-channel transistor N5, the gate line N6G of the n-channel transistor N6, and the conductive area S5R of the column selection transistor S5. Then, metal contacts MC for a metal layer are formed. Furthermore, although not illustrated, local input/output lines LI, LIOB may be included in the semiconductor device layout illustrated in FIG. 4.

Figure 5:
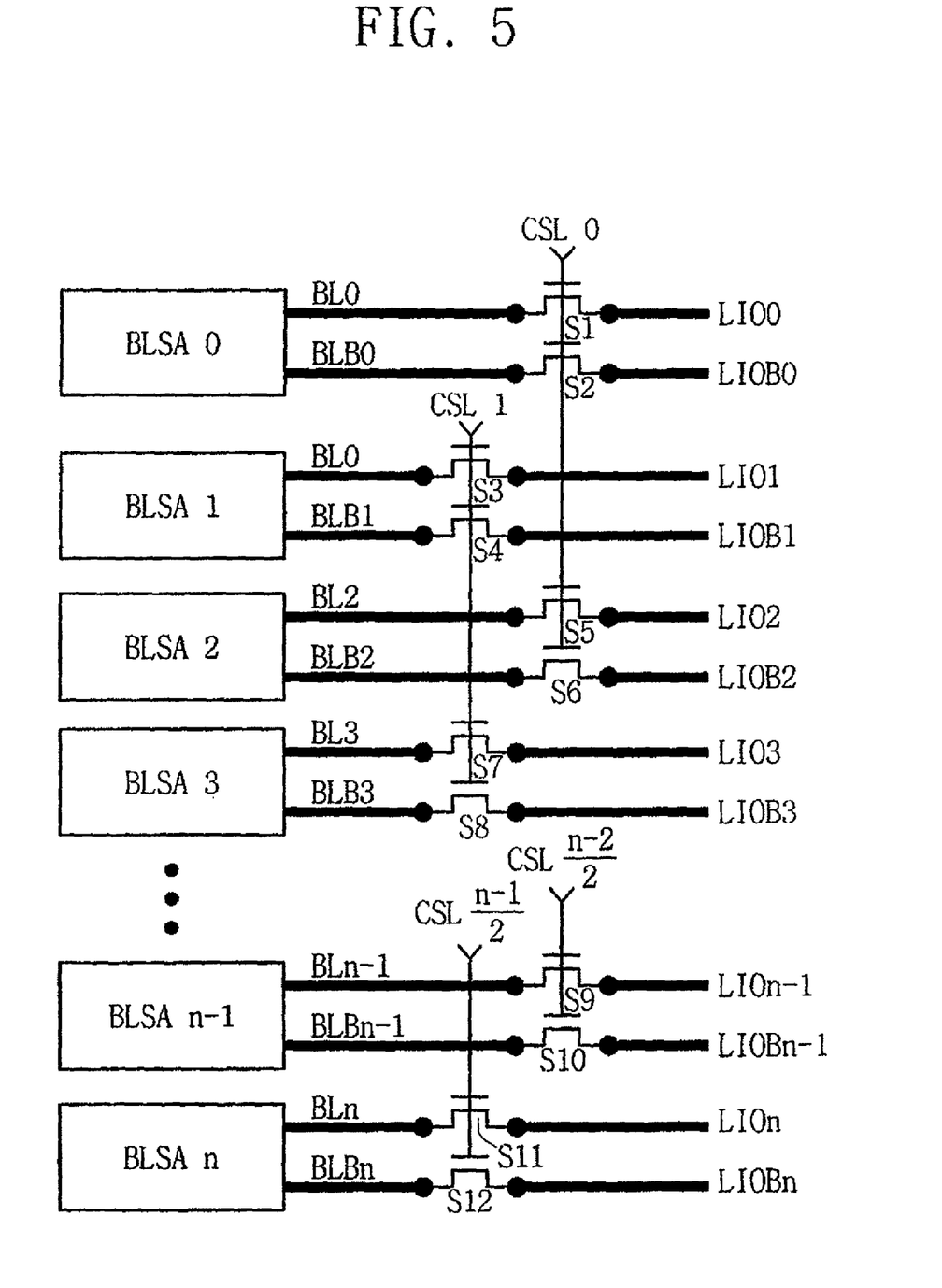
FIG. 5 illustrates a core structure of semiconductor memory device according to an embodiment.

As illustrated in FIG. 5, a semiconductor memory device may include the plurality of bit line sense amplifiers BLSA0 to BLSAn, the plurality of main bit lines BL0 to BLn, the plurality of sub bit lines BLB0 to BLBn, the plurality of column selection switches S1 to S12, the plurality of main local input/output lines LIO0 to LIOn, the plurality of sub local input/output lines LIOB0 to LIOBn and a plurality of column selection lines CSL0 to CSL(n−1)/2.

In this embodiment, the bit line sense amplifiers BLSA may each be coupled to a bit line pair including one main bit line BL and one sub bit line BLB. The main bit line BL and the sub bit line BLB may be coupled to a main local input/output line LIO and the sub local input/output line LIOB, respectively. The main bit line BL may be coupled to a main local input/output line LIO via a column selection switch S. Additionally, the sub bit line may be coupled to a sub local input/output line LIOB via a column selection switch S. One or more column selections switches S coupled to a main bit line BL and a sub bit line BLB of a single bit line sense amplifier BLSA may be controlled by a single column selection line CSL. In one embodiment, a single column selection line CSL may be coupled to two or more bit line sense amplifiers BLSA. Further, in this embodiment, the two or more bit line sense amplifiers BLSA that are coupled to a single column selection line CSL may not share an active area of a semiconductor memory device.

As noted above, in one embodiment, a column selection line CSL may control column selection switches S of two or more bit line sense amplifiers BLSA. In one example, two bit line sense amplifiers BLSA 0 and BLSA 2 may each include two column selection switches S1-S2 and S3-S4, respectively. The column selection switches S1-S4 may be controlled by a single column selection line CSL0. The two bit line sense amplifiers BLSA0 and BLSA2 may be configured in a semiconductor device layout so as not to share an active area. Conversely, bit line sense amplifiers that do share an active area in a semiconductor memory device, i.e., BLSA0 and BLSA1 may be disposed so as not to share one column selection line signal CSL. Further, although not illustrated, the bit line sense amplifiers BLSA 0-BLSA n may include a plurality of PMOS and NMOS transistors configured in a latch configuration. The scope of the present invention is not so limited, however.

The semiconductor memory device layout described above may improve performance of a semiconductor memory device. For example, a semiconductor memory device employing a layout as set forth above may exhibit an improved sensing level in a plurality of bit line sense amplifiers sharing one column selection line signal CSL.

As described above, according to some embodiments of the invention, transistors constituting a bit line sense amplifier can be disposed with different layout structures as to whether or not to share a column selection line signal, thereby improving a sensing level of bit line sense amplifier and preventing or substantially reducing data sensing error.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A layout structure of bit line sense amplifiers for use in a semiconductor memory device, the layout structure comprising:

first and second bit line sense amplifiers arranged to share and be electrically controlled by a first column selection line signal, and each including a plurality of transistors; wherein:

each of the plurality of transistors forming the first bit line sense amplifier is arranged so as not to share an active region with any transistors forming the second bit line sense amplifier, the respective active regions of the transistors of each of the first and second bit line sense amplifier are at least partially aligned along a first direction, the respective active regions of the first bit line sense amplifier defining a first row and the respective active regions of the second bit line sense amplifier defining a second row, and at least one transistor of the first and second bit line sense amplifiers, and at least one transistor of a third bit line sense amplifier, controlled by a second column selection line signal different from the first column selection line signal, share a portion of an active region.

2. The structure as claimed in claim 1, wherein each of the first and second bit line sense amplifiers comprises at least two p-channel transistors and at least two n-channel transistors.

3. The structure as claimed in claim 1, further comprising at least one bit line coupled to each of the first and second bit line sense amplifiers, each at least one bit line being electrically coupled to a corresponding local input/output line when the first column selection line signal is enabled.

4. The structure as claimed in claim 1, wherein all transistors of one of the first and second bit line sense amplifiers share a portion of an active region with all transistors of the third bit line amplifier.

5. The structure as claimed in claim 1, wherein each of the plurality of transistors of the first and second bit line sense amplifiers includes a gate line extending along the first direction, and the active regions of the first and second bit line sense amplifiers sharing the first column selection line signal are spaced apart from each other along a second direction, the second direction being perpendicular to the first direction.

6. The structure as claimed in claim 1, further comprising:
a plurality of column selection transistors, wherein at least two of the column section transistors share a portion of a same active region.

7. The structure as claimed in claim 6, wherein one of the column selection transistors sharing the same active region is coupled to the first column selection line signal and the other of the column selection transistors sharing the same active region is connected to the second column selection line signal.

8. The structure as claimed in claim 6, wherein all of the transistors of at least the first bit line sense amplifier is arranged between a first transistor of the plurality of column selection transistors and a second transistor of the plurality of column selection transistors, the first and the second column selection transistors being coupled to the first column selection line signal.

9. The layout structure as claimed in claim 1, wherein the first row is parallel to the second row.

10. A layout structure of bit line sense amplifiers for use in a semiconductor memory device, the layout structure comprising first and second bit line sense amplifiers electrically controlled by a first column selection line signal, the first and second bit line sense amplifiers each including at least a first transistor of a first type and a second transistor of a second type that each include a gate line defining conductive areas,
wherein:
the first type is of a different conductive type than the second type;
the gate line of the first and second transistors of the first bit line sense amplifier extend along a first direction,
the first and second bit line sense amplifiers are arranged such that the gate lines of the first transistors of the first and second bit line sense amplifiers and the gate lines of the second transistors of the first and second bit line sense amplifiers are at least partially aligned so as to at least partially define columns extending along a second direction that is perpendicular to the first direction, and
conductive areas of the at least the first and second transistors of the first and second bit line sense amplifiers are at least partially aligned and spaced apart from each other along the respective column.

11. The structure as claimed in claim 10, wherein at least a portion of at least one of the first and second bit line sense amplifiers is disposed along the column adjacent to at least a third bit line sense amplifier controlled by a second column selection line signal different from the first column selection line signal.

12. The structure as claimed in claim 11, wherein the transistors of the bit line sense amplifiers that are controlled by different ones of the column selection line signals are adjacent to each other along the respective column so as to share a portion of an active region.

13. The layout structure of claim 10, wherein the first and the second bit line sense amplifiers each include a third transistor of the first type and a fourth transistor of the second type that each include a gate line, and the gate lines of the first, second, third, and fourth transistors of the first bit line sense amplifier extend along the first direction and are aligned along a line extending along the first direction so as to define a first row, and the gate lines of the first, second, third, and fourth transistors of the second bit line sense amplifier extend along another line extending along the first direction so as to define a second row.

14. The layout structure as claimed in claim 13, wherein the conductive areas of the first, second, third, and fourth transistors of the first bit line sense amplifier are respectively aligned with the conductive areas of the first, second, third, and fourth transistors of the second bit line sense amplifier along the second direction so as to at least partially define first, second, third, and fourth columns.

15. A semiconductor memory device, comprising:
a plurality of transistors arranged to form first and second bit line sense amplifiers;
a first column selection line coupled to the first and second bit line amplifiers, and
a plurality of column selection transistors corresponding to the first and second bit line sense amplifiers being arranged between the transistors of the first and/or second bit lines sense amplifiers,
wherein an active region of any transistor of the first bit line sense amplifier is separate from an active region of any transistor of the second bit line sense amplifier.

16. The device as claimed in claim 15, wherein each of the first and second bit line sense amplifiers comprises at least two p-channel transistors and at least two n-channel transistors.

17. The device as claimed in claim 15, further comprising at least one bit line coupled to each of the first and second bit line sense amplifiers, each at least one bit line being electrically coupled to a corresponding local input/output line when the first column selection line signal is enabled.

18. The device as claimed in claim 15, wherein at least one transistor of the first and second bit line sense amplifiers, and at least one transistor of a third bit line sense amplifier, controlled by a second column selection line signal different from the first column selection line signal, share a portion of an active region.

19. The device as claimed in claim 18, wherein all transistors of one of the first and second bit lines sense amplifiers share a portion of an active region with all transistors of the third bit line amplifier.

20. The device as claimed in claim 15, wherein the first and second bit line sense amplifiers each include at least one transistor including a gate line defining conductive areas,
wherein:
the gate line of the at least one transistor of the first bit line sense amplifier extends along a first direction,
the first and second bit line sense amplifiers are arranged such that the gate line of the at least one transistor of the second bit line sense amplifier is at least partially aligned with the gate line of the at least one transistor of the first bit line sense amplifier so as to at least partially define a column extending along a second direction that is perpendicular to the first direction, and
the active areas of the at least one transistors of the first and second bit line sense amplifiers are at least partially aligned with each other along the column.

21. A layout method of bit line sense amplifiers for use in a semiconductor memory device, the method comprising:
arranging a plurality of column selection transistors;
arranging a plurality of transistors arranged to form first and second bit line sense amplifiers; and coupling a first column selection line to the first and second bit line amplifiers, wherein the transistors of the first and second bit line sense amplifiers are arranged directly between the column selection transistors corresponding to the first and second bit lines amplifiers, and wherein an active region of any transistor of the first bit line sense amplifier is separate from an active region of any transistor of the second bit line sense amplifier.

22. A layout structure of bit line sense amplifiers for use in a semiconductor memory device, the layout structure comprising:

first and second bit line sense amplifiers arranged to share and be electrically controlled by a first column selection line signal, and each including a plurality of transistors; wherein:

each of the plurality of transistors forming the first bit line sense amplifier is arranged so as not to share an active region with any transistors forming the second bit line sense amplifier, the respective active regions of the transistors of each of the first and second bit line sense amplifier are at least partially aligned along a first direction, the respective active regions of the first bit line sense amplifier defining a first row and the respective active regions of the second bit line sense amplifier defining a second row, and a plurality of column selection transistors, the column selection transistors corresponding to the first and second bit line sense amplifiers being arranged between the transistors of the first and second bit lines sense amplifiers along the first and second rows.

23. A layout structure of bit line sense amplifiers for use in a semiconductor memory device, the layout structure comprising:

first and second bit line sense amplifiers arranged to share and be electrically controlled by a first column selection line signal, and each including a plurality of transistors; wherein:

each of the plurality of transistors forming the first bit line sense amplifier is arranged so as not to share an active region with any transistors forming the second bit line sense amplifier, the respective active regions of the transistors of each of the first and second bit line sense amplifier are at least partially aligned along a first direction, the respective active regions of the first bit line sense amplifier defining a first row and the respective active regions of the second bit line sense amplifier defining a second row, and a plurality of column selection transistors, the transistors of the first and second bit line sense amplifiers being arranged between the column selection transistors corresponding to the first and second bit lines amplifiers along the first and second rows.

* * * * *